(12) United States Patent
Xiang

(10) Patent No.: US 12,136,559 B2
(45) Date of Patent: Nov. 5, 2024

(54) GRAPHITE PLATE

(71) Applicant: ENKRIS SEMICONDUCTOR, INC., Suzhou (CN)

(72) Inventor: Peng Xiang, Suzhou (CN)

(73) Assignee: ENKRIS SEMICONDUCTOR, INC., Suzhou (CN)

( * ) Notice: Subject to any disclaimer, the term of this patent is extended or adjusted under 35 U.S.C. 154(b) by 103 days.

(21) Appl. No.: 17/583,646

(22) Filed: Jan. 25, 2022

(65) Prior Publication Data

US 2022/0238363 A1 Jul. 28, 2022

(30) Foreign Application Priority Data

Jan. 26, 2021 (CN) .......................... 202120219432.7

(51) Int. Cl.
*H01L 21/673* (2006.01)
(52) U.S. Cl.
CPC .. *H01L 21/67379* (2013.01); *H01L 21/67306* (2013.01)
(58) Field of Classification Search
CPC .............................................. H01L 21/67379
USPC ........................................................ 206/710
See application file for complete search history.

(56) References Cited

U.S. PATENT DOCUMENTS

| 3,436,255 | A | * | 4/1969 | Westhoff | ........... H01L 21/67103 |
| | | | | | 219/552 |
| 5,734,181 | A | * | 3/1998 | Ohba | .................. H01L 29/0847 |
| | | | | | 257/E21.345 |
| 7,781,061 | B2 | * | 8/2010 | Garcia | .............. H01L 21/02389 |
| | | | | | 428/688 |
| 10,167,571 | B2 | * | 1/2019 | Krishnan | ................ B23P 19/04 |
| 2003/0080109 | A1 | * | 5/2003 | Choi | .................. H01L 21/67103 |
| | | | | | 219/468.1 |
| 2016/0312381 | A1 | * | 10/2016 | Norimatsu | .............. C30B 25/20 |
| 2018/0012790 | A1 | * | 1/2018 | Parkhe | .............. H01L 21/68735 |
| 2020/0043827 | A1 | * | 2/2020 | Shen | .................... H01L 23/3736 |

FOREIGN PATENT DOCUMENTS

CN 107195579 A * 9/2017 ....... H01L 21/67383

* cited by examiner

*Primary Examiner* — Ernesto A Grano
*Assistant Examiner* — Symren K Sanghera
(74) *Attorney, Agent, or Firm* — Westbridge IP LLC

(57) ABSTRACT

Disclosed is a graphite plate to solve a problem of poor performance uniformity of an epitaxial wafer obtained during carrying on epitaxial growth of material using the graphite plate. A graphite plate includes: a graphite plate body, includes a carrying recess and a recess located on one side of the carrying recess away from a central point of the graphite plate body; and a stopper, which is embedded in the recess in a matching manner, and the stopper protrudes from the bottom surface of the carrying recess to form a limiting structure.

14 Claims, 6 Drawing Sheets

GRAPHITE PLATE

CROSS-REFERENCE TO RELATED APPLICATIONS

This application claims priority to Chinese Patent Application No. 202120219432.7, filed on Jan. 26, 2021, which is hereby incorporated by reference in its entirety.

TECHNICAL FIELD

The application relates to the technical field of semiconductor material growth device, more particular, to a graphite plate.

BACKGROUND

A Light Emitting Diode (LED) is a solid-state semiconductor diode light-emitting device, which is widely used in lighting fields such as indicator light, display screens, etc. At the present stage, a method of producing LED wafers is mainly realized by metal-organic chemical vapor deposition (MOCVD) and it's process may be briefly described as follows: a substrate is placed into a recess of a graphite plate, the graphite plate loaded with the substrate is placed into the MOCVD reaction chamber, the reaction chamber temperature is heated to a preset temperature, and an organic metal compound and the group V gases are input, so that a chemical bond thereof may be broken on the substrate and re-polymerize to form a LED epitaxial layer.

However, an epitaxial wafer obtained according to the above process has poor performance uniformity, such as, uneven LED wavelength, uneven two-dimensional electron gas, etc.

SUMMARY

In view of this, embodiments of the application are devoted to providing a graphite plate to solve a problem of poor performance uniformity of an epitaxial wafer obtained by using a graphite plate for epitaxial growth.

The application provides a graphite plate for epitaxial growth of a semiconductor material. A graphite plate includes: a graphite plate body, including a carrying recess and a recess disposed at one side of the carrying recess away from a central point of the graphite plate body; and a stopper, which is embedded in the recess in a matching manner, and the stopper protrudes from a bottom surface of the carrying recess to form a limiting structure. In accordance with the graphite plate provided by embodiments of the application, by providing the stopper, a sidewall of a substrate and a sidewall of the carrying recess are spaced apart, so as to avoid direct contact between the sidewall of the substrate and the sidewall of the carrying recess, and thus the contact point is overheated can be avoided, so that the epitaxial wafer is heated more evenly, thus improving the performance uniformity of epitaxial wafer.

In an embodiment, a heat insulation layer is provided between the recess and the stopper. Thus, the heat transfer between the graphite plate body and the stopper may be reduced, thereby avoiding the overheating of the stopper to further balance the heated temperature of the substrate.

In an embodiment, the stopper is coated in the heat insulation layer. A heat insulation layer is formed on the outer surface of the stopper, on the one hand, it is easy for industrial production; on the other hand, it ensures all-round heat insulation.

In an embodiment, a heat conducting hole is provided on the stopper. That improve heat dissipation of the stopper by using the heat conducting hole, thereby further avoiding the overheating of the stopper, balancing the heated temperature of the substrate.

In an embodiment, the stopper includes a stop surface perpendicular to a bottom surface of the carrying recess, and the stop surface is a curved surface. Since the substrate is usually the shape of a disk, by setting the stop surface to be a curved surface, a surface matching the side of the substrate can be formed to avoid stress concentration points at the contact surface between the substrate and the stopper, thereby improving the reliability of the stopper.

In an embodiment, the carrying recess and the graphite plate body are both round, and the stopper is symmetrical about an extension line of a connecting line between a central point of the graphite plate body and a central point of the carrying recess. Thus, it may ensure that the centrifugal force on the substrate reacts at the central point of the stopper, so that the force on the stopper is more uniform, and the reliability of the stopper is further improved.

In an embodiment, the stopper includes a stop part perpendicular to the bottom surface of the carrying recess, and a predetermined spacing is provided between the stop part and a sidewall of the carrying recess. Thus, the heat conduction between the graphite plate body and the stopper can be reduced, so as to avoid the overheating of the stopper, thereby improving the heating uniformity of substrate.

In an embodiment, the stopper is an L-shaped stopper, and the opening of the L-shaped stopper faces away from the central point of the graphite plate body. The L-shaped stopper is simple in structure and easy to be realized in industry.

In an embodiment, a part of the stopper protruding from the bottom surface of the carrying recess is provided to be inclined toward the central point of the graphite plate.

In an embodiment, the outer edge line at the corner of the L-shaped stopper is arc-shaped. Thus, a chamfer is disposed at the corner of the stopper, so that facilitate the mounting and dismounting of the stopper and the recess.

In an embodiment, a material of the stopper comprises any one of silicon carbide and quartz. Thus, on the one hand, sufficient hardness can be ensured; on the other hand, due to the low heat conductivity of silicon carbide and quartz, it may be avoided that the stopper is overheated, thereby further improving the uniformity of substrate heating.

In accordance with a graphite plate provided by embodiments of the application, by using a stopper to space a sidewall of a substrate and a sidewall of the carrying recess, so as to avoid direct contact between the sidewall of the substrate and the sidewall of the carrying recess, and thus the contact point is overheated can be avoided, so that the epitaxial wafer is heated more uniformly, thus improving the performance uniformity of the epitaxial wafer.

DETAILED DESCRIPTION OF THE EMBODIMENTS

As described in the background, an epitaxial wafer obtained by using the graphite plate for epitaxial growth has poor performance uniformity. Through research, the inventor found that the reasons for the poor uniformity performance of epitaxial wafer include at least: in a process of the epitaxial growth, a substrate rotates together with the graphite plate, and due to a centrifugal force, the edge of the substrate away from the central point of the graphite plate is directly contact with the sidewall of the carrying recess of the graphite plate, which results in that a temperature of the contact position is higher than that of other positions at the sidewall of the substrate, and uneven heating of the substrate, furthermore, leading to plastic deformation of the substrate. It is precisely because of the plastic deformation of the substrate that the performance of the epitaxial wafer obtained by epitaxial growth is not uniform.

In view of this, an embodiment of the present application provides a graphite plate, including: a graphite plate body and a stopper. The graphite plate body includes a carrying recess and a recess located at one side of the carrying recess away from a central point of the graphite plate body. A stopper is embedded in the recess in a matching manner, and the stopper protrudes from the bottom surface of the carrying recess to form a limiting structure. In accordance with the graphite plate provided by the embodiments of the present application, by disposing a stopper at a position where a sidewall of the substrate and a sidewall of the carrying recess are in contact, the sidewall of the substrate and the sidewall of the carrying recess are spaced apart, so as to avoid direct contact between the sidewall of the substrate and the sidewall of the carrying recess causing the contact point to have a higher temperature than the non-contact position, thereby ensuring that the epitaxial wafer is heated more evenly, to improve the performance uniformity of the epitaxial wafer.

The technical schemes in the embodiments of the present application will be clearly and completely described below in combination with the accompanying drawings in the embodiments of the present application. Obviously, the described embodiments are only a part of the embodiments of the application, rather than all the embodiments. Based on the embodiments of the application, all other embodiments obtained by those of ordinary skill in the art without creative work shall fall within the protection scope of the application.

Figure 1:
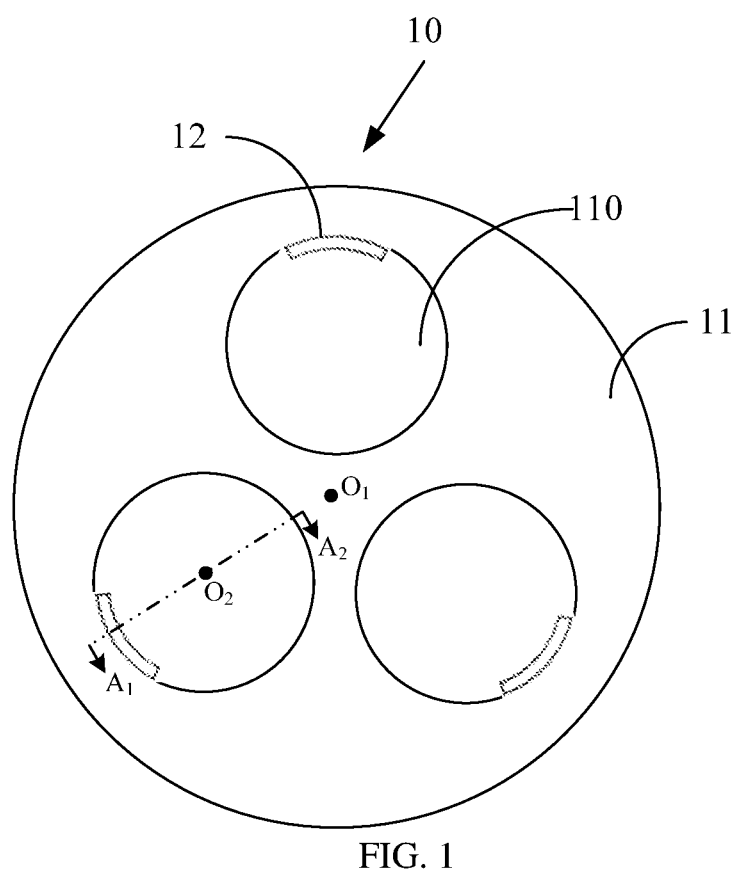
FIG. 1 is a schematic diagram of a structure of a graphite plate provided by an embodiment of the application.
Figure 2:
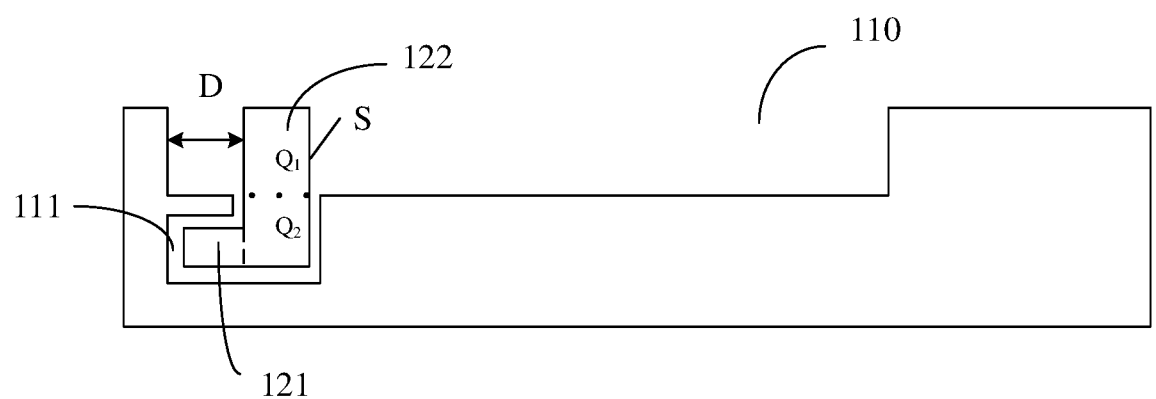
FIG. 2 is a local cross-sectional schematic diagram of the graphite plate along the line $A_1A_2$ shown in FIG. 1 provided by the first embodiment of the application.

FIG. 1 is a schematic diagram of a structure of a graphite plate provided by an embodiment of the application. FIG. 2 is a local cross-sectional schematic diagram of the graphite plate along the line $A_1A_2$ as shown in FIG. 1 provided by the first embodiment of the application. Combined with FIG. 1 and FIG. 2, a graphite plate 10 includes a graphite plate body 11, the graphite plate body 11 includes a carrying recess 110, and a recess 111 is disposed at the bottom surface of the carrying recess 110, the recess 111 is located at the edge area of the bottom surface of the carrying recess 110. The graphite plate 10 also includes a stopper 12, a stopper 12 is embedded in the recess 111 in a matching manner, and the stopper 12 protrudes from the bottom surface of the carrying recess 110 to form a limiting structure.

The graphite plate body 11 is provided with a plurality of carrying recesses 110, each of the carrying recesses 110 is used to carry a substrate, and an epitaxial wafer is obtained after a substrate has been epitaxial grown with a semiconductor material. The shape of the carrying recess 110 may be set according to the shape of the substrate to be grown. In an embodiment, the carrying recess 110 is a circular recess. A stopper 12 is disposed at the edge region of the carrying recess 110 away from the central point $O_1$ of the graphite plate 12. Specifically, a recess 111 is provided at the bottom surface of the carrying recess 110, and one end of the stopper 12 is embedded in the recess 111 to realize the fixing of the stopper 12; the other end of the stopper 12 protrudes from the bottom surface of the carrying recess 110, which is in contact with the sidewall of the substrate to make sure that a part of the sidewall of the substrate subsequently placed in the carrying recess 110 and the sidewall of the carrying recess 110 are spaced apart, thereby avoiding direct contact between the sidewall of the substrate and the sidewall of the carrying recess 110 causing the contact point to have a higher temperature of than other positions on the sidewall of the substrate, thereby ensuring that the substrate is heated more uniformly, and thus an epitaxial wafer with better performance uniformity is obtained.

A shape of the stopper 12 and a shape of the recess 111 restrict each other, so that a chimeric relationship can be realized. In an embodiment, the stopper 12 is fixed to the recess 111 by means of a detachable connection. That is, the chimeric relationship between the recess 111 and the stopper 12 is reversible, that is, the stopper 12 may be connected to the recess 111 in an embedded manner, or the recess 111 and the stopper 12 may also be released from chimera to separate from each other. The recess 111 and the stopper 12 are implemented in a detachable connection relationship, which facilitates the replacement of the stopper 12 and improves the utilization rate of the graphite plate body 11.

In an embodiment, as shown in FIG. 2, the stopper 12 includes a stop part 122 perpendicular to the bottom surface of the carrying recess 110, there is a predetermined spacing D between the stop part 122 and the sidewall of the carrying recess 110. Specifically, the stopper 12 includes an integrated fixing part 121 and the stop part 122, and the fixing part 121 is embedded in the recess 111 for connecting the stopper 12 to the graphite plate body 11; the stop part 122 protrudes from the bottom surface of the carrying recess 110, which is in contact with the sidewall of the substrate, to make sure that a part of the sidewall of the substrate and the sidewall of the carrying recess 110 are spaced apart, a dividing line between the fixing part 121 and the stop part 122 as shown as the dotted line in FIG. 2. By setting the spacing between the stopper 122 and the sidewall of the carrying recess 110, the heat conduction between the graphite plate body 11 and the stopper 12 can be weakened, so as to increase the temperature difference between the graphite plate body 11 and the stopper 12, so that even if the stopper 12 is in direct contact with the substrate sidewall, it will not cause that the temperature of the contact point is too high compared to other positions on the sidewall of the substrate, thereby further improving the heating uniformity of substrate.

Specifically, in an embodiment, the stopper 12 is an L-shaped stopper, and an opening of the L-shaped stopper faces away from the central point O1 of the graphite plate body 11. In this case, in order to achieve that the recess 111 is embedded in the stopper 12 in a matching manner, in an embodiment, the cross section of the recess 111 in the thickness direction of the graphite plate body 11 is a rectangle, the recess 111 includes an opening, and the width of the opening is smaller than the width of the bottom surface of the rectangular recess 111. In this case, when the fixing part 121 of the L-shaped stopper is embedded in the recess 111, the upper wall of the recess 111 may form a stopping structure, so as to restrict the stopper 12 in the recess 111, thereby releasing the chimeric relationship between the stopper 12 and the recess 111.

In an embodiment, as shown in FIG. 2, the stopper 12 includes a stop surface S which is perpendicular to the bottom surface of the carrying recess 110, and the stop surface S is a curved surface. That the stop surface S is perpendicular to the bottom surface of the carrying recess 110 means that the normal plane of the stop surface S is perpendicular to the bottom surface of the carrying recess 110. The stop surface S is subsequently in contact with the sidewall of the substrate to limit the position of the substrate.

Specifically, the stop part 122 includes the stopper surface S. For example, the stop part 122 is in the shape of an arc-shaped plate. Thus, the stop surface S may be adapted to the shape of the sidewall of the substrate, so as to avoid a stress concentration point when the substrate and the stop surface S are in contact. For example, the surface of the stop part 122 on the side close to the central point $O_1$ of the carrying recess 110 is arc-shaped. The recess 111 is implemented as a strip-shaped recess, the strip-shaped recess is arc-shaped, and the strip-shaped recess, the stop part 122 and the carrying recess 110 are arranged concentrically. Thus, it can be ensured that the distance between the part of the sidewall of the substrate in contact with the stop surface S and the sidewall of the carrying recess 110 is equal everywhere, which further ensures that the substrate is evenly heated. For another example, the stop part 122 is divided into upper and lower regions, a second region $Q_2$ located in the recess 111 and a first region $Q_1$ protruding from the bottom surface of the carrying recess 110, the interface of the first region $Q_1$ and the second region $Q_2$ is coplanar with the bottom surface of the carrying recess 110, and the interface is shown as the dotted line in FIG. 2. The first region $Q_1$ located above includes a first surface facing the central point of the carrying recess 110, and the first surface is an arc-shaped surface to form a stop surface for contacting the sidewall of the substrate; the second region $Q_2$ located below includes a second surface facing the central point of the carrying recess 110, and the second surface is a flat surface for contacting with the sidewall of the recess 111. The first surface and the second surface may be connected by a third surface, and the third surface is coplanar with the bottom wall of the carrying recess 110, for example, the third surface is a crescent shape. In this case, the recess 111 may be implemented as strip-shaped recess, and the strip-shaped recess is in the shape of straight line. The linear strip-shaped recess is convenient for production and industrial implementation.

In an embodiment, a heat insulation layer (not shown in the figure) is further provided between the recess 111 and the stopper 12. The heat insulation layer may be a filler disposed in the recess 111, such as foam; the heat insulation layer may also be a coating, and the coating may be formed on at least part of the inner wall of the recess 111, and may also be formed on at least part of the outer wall of the stopper 12. By providing the heat insulation layer, the heat conduction between the graphite plate body 11 and the stopper 12 can be weakened, so as to increase the temperature difference between the graphite plate body 11 and the stopper 12, so that even if the stopper 12 is in direct contact with the substrate, the temperature of the contact point will not be too high compared to the temperature of other positions on the sidewall of the substrate, thereby further improving the heating uniformity of substrate. In an embodiment, the stopper 12 is coated in the heat insulation layer. The heat insulation layer is formed on the outer surface of the stopper 12, on the one hand, which is easy for industrial production, on the other hand, which may ensure all-round heat insulation, thereby improving heat insulation effect.

In an embodiment, as shown in FIG. 1, the carrying recess 110 and the graphite plate body 11 are both round, and the stopper 12 is symmetrical about an extension line of a connecting line between a central point $O_1$ of the graphite plate body 11 and a central point $O_2$ of the carrying recess 110. Thus, it may ensure that the centrifugal force on the substrate reacts at the central point of the stopper 12, so that the force on the stopper 12 is more uniform, and the reliability of the stopper is improved.

In an embodiment, a material of the stopper 12 includes any one of silicon carbide and quartz. Thus, on the one hand, sufficient hardness can be ensured; on the other hand, due to low heat conductivity coefficient of silicon carbide and quartz, the heat conduction between the graphite plate body 11 and the stopper 12 is further weakened, thereby further improving the uniformity of substrate heating.

Figure 3:
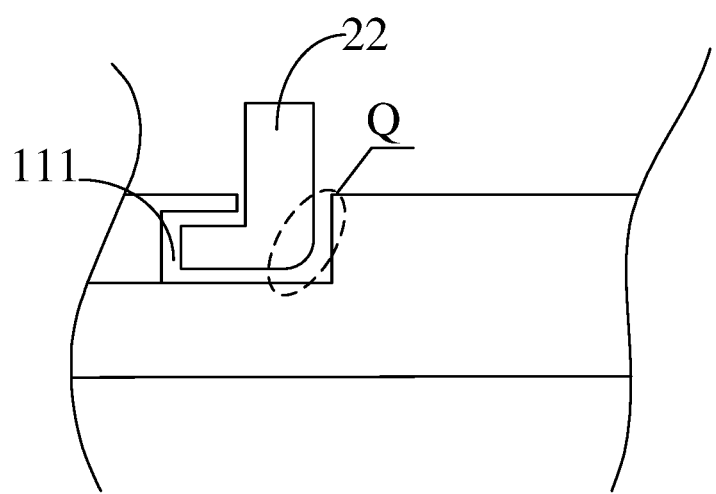
FIG. 3 is a local cross-sectional schematic diagram of the graphite plate along the line A1A2 shown in FIG. 1 provided by the second embodiment of the application.

FIG. 3 is a local cross-sectional schematic diagram of the graphite plate along the line $A_1A_2$ as shown in FIG. 1 provided by the second embodiment of the application. As shown in FIG. 3, the difference between the graphite plate 20 and the graphite plate 10 shown in FIGS. 1 and 2 is only that the outer edge line at the corner Q of a L-shaped stopper 22 is arc-shaped, that is, a chamfer is disposed at the corner of the L-shaped stopper 22, so as to facilitate the dismounting of the L-shaped stopper 22 and the recess 111.

Figure 4:
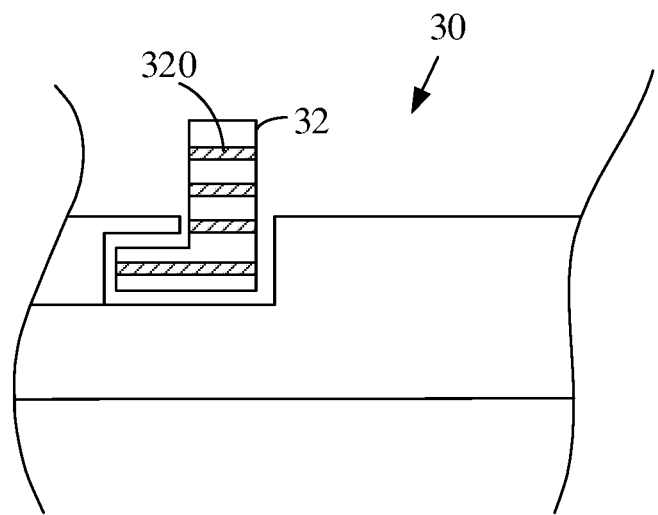
FIG. 4 is a local cross-sectional schematic diagram of the graphite plate along the line A1A2 shown in FIG. 1 provided by the third embodiment of the application.

FIG. 4 is a local cross-sectional schematic diagram of the graphite plate along the line $A_1A_2$ as shown in FIG. 1 provided by the third embodiment of the application. As shown in FIG. 4, the difference between the graphite plate 30 and the graphite plate 10 shown in FIGS. 1 and 2, and the graphite plate 20 shown in FIG. 3 is only that a heat conducting hole 320 is provided on a stopper 32. A shape and an arrangement of the heat conducting hole 320 may be reasonably set in accordance with actual needs. In an embodiment, the stopper 32 is provided with a plurality of heat conducting holes 320 arranged in parallel, and each of heat conducting holes 320 penetrates the stopper 32 in the thickness direction. The thickness direction of the stopper 32 refers to the direction from the central point $O_1$ of the graphite plate body 11 to the central point $O_2$ of the carrying recess 110.

In accordance with the graphite plate 30 provided in the embodiment, the heat dissipation of the stopper 32 is improved by using the heat conducting hole 320, and it is further avoided that the stopper 32 is overheated, thereby balancing the heating of substrate.

Figure 5:
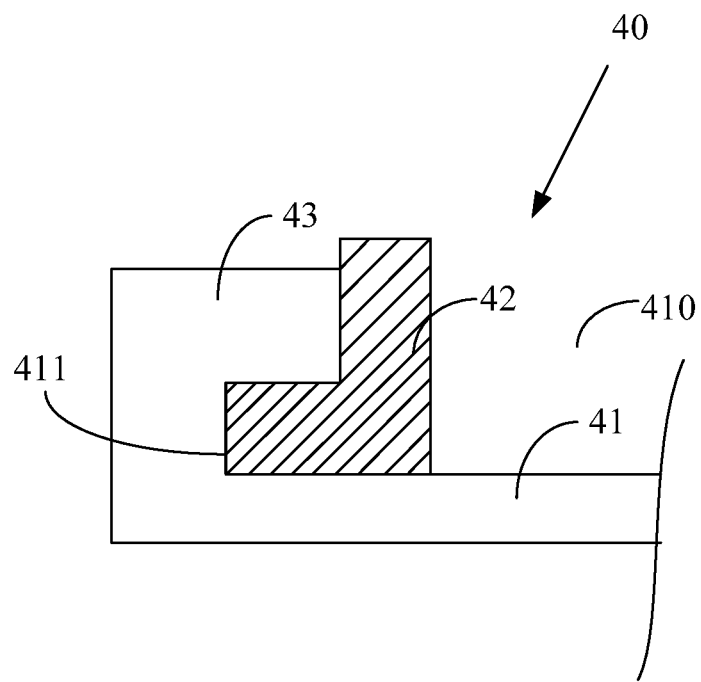
FIG. 5 is a schematic diagram of a structure of a graphite plate provided by another embodiment of the application.

FIG. 5 is a schematic diagram of a structure of a graphite plate provided by another embodiment of the application. As shown in FIG. 5, the difference between a graphite plate 40 and the graphite plate 10 shown in FIG. 1 is only that the position of the recess is different. Specifically, in the graphite plate 40, a recess 411 is disposed at the sidewall of the carrying recess 410 away from the central point $O_1$ of the graphite plate body 41, and the opening of the recess 411 faces the central point $O_1$ of the graphite plate body 41.

Thus, the production process is simpler, the upper wall thickness of the recess 411 is larger, and the structure is more reliable.

The recess 411 may be disposed at any position of the sidewall of the carrying recess 410, for example, as shown in FIG. 5, the recess 411 is disposed at the bottom of the sidewall of the carrying recess 410, a part of sidewall of the recess 411 is flush with bottom wall of the carrying recess 410.

In this embodiment, a stopper 42 may adopt the structural form provided in any of the above embodiments, such as an L-shaped stopper.

Figure 6:
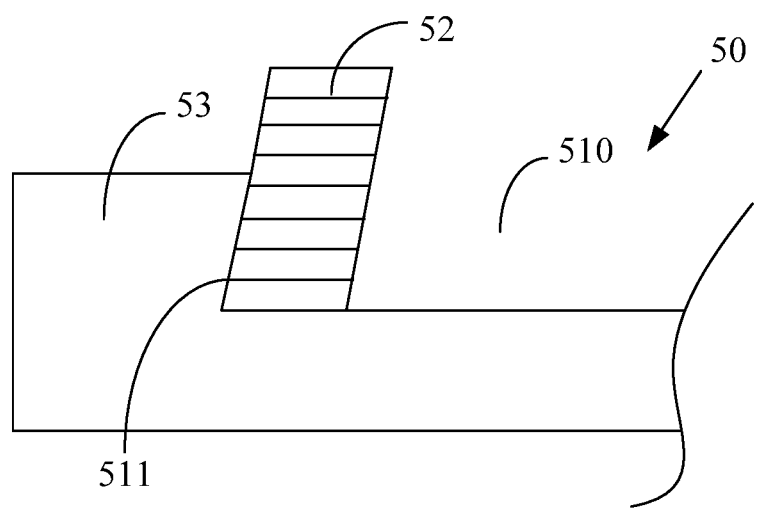
FIG. 6 is a schematic diagram of a structure of a graphite plate provided by another embodiment of the application.

FIG. 6 is a schematic diagram of a structure of a graphite plate provided by another embodiment of the application. As shown in FIG. 6, in the graphite plate 50, a part of a stopper 52 protruding from the bottom surface of a carrying recess 510 is inclined toward the central point $O_1$ of the graphite plate. Thus, the stopper 52 can further limit the position of the substrate in the vertical direction to prevent the substrate from flying out of the carrying recess 510 during the rotation of graphite plate, thereby further improving reliability.

In an embodiment, the section of a recess 511 in the direction perpendicular to the thickness of the graphite plate body is triangular, and the opening of the recess 511 faces the central point $O_1$ of the graphite plate body. Thus, the stopper 52 may be implemented as a stop plate, which has a simpler structure and more convenient disassembly.

The above descriptions are only preferred embodiments of the application, and are not intended to limit the application. Any modifications, equivalent replacements, or the like, made within the spirit and principles of the application shall fall within the protection scope of the application.

What is claimed is:

1. A graphite plate, for epitaxial growth of a semiconductor material, comprising:
   a graphite plate body, comprising a carrying recess and a recess disposed at one side of the carrying recess away from a central point of the graphite plate body; and
   a stopper embedded in the recess in a matching manner and protruding from a bottom surface of the carrying recess to form a limiting structure,
   wherein the stopper comprises a fixing part embedded in the recess, the recess comprises an opening, and along a direction from a central point of the graphite plate body to a central point of the carrying recess, a width of the opening is less than a width of a bottom surface of the recess, so as to restrict the fixing part in the recess.

2. The graphite plate according to claim 1, wherein a heat insulation layer is provided between the recess and the stopper.

3. The graphite plate according to claim 2, wherein the stopper is coated in the heat insulation layer.

4. The graphite plate according to claim 1, wherein a heat conducting hole is provided in the stopper.

5. The graphite plate according to claim 4, wherein the heat conducting hole penetrates the stopper in a direction along the central point of the graphite plate body to the central point of the carrying recess.

6. The graphite plate according to claim 1, wherein the stopper has a stop surface perpendicular to a bottom surface of the carrying recess, and the stop surface is a curved surface.

7. The graphite plate according to claim 1, wherein the carrying recess and the graphite plate body are both round, and the stopper is symmetrical about an extension line of a connecting line between the central point of the graphite plate body and the central point of the carrying recess.

8. The graphite plate according to claim 1, wherein the stopper is an L-shaped stopper, and an opening of the L-shaped stopper faces away from the central point of the graphite plate body.

9. The graphite plate according to claim 8, wherein a chamfer is disposed at one side of the L-shaped corner away from the central point of the graphite plate body.

10. The graphite plate according to claim 1, wherein a material of the stopper comprises any one of silicon carbide and quartz.

11. The graphite plate according to claim 1, wherein one end of the stopper is embedded in the recess, when the stopper is to be replaced, the stopper is removed from the recess, and one end of a new stopper is embedded in the recess.

12. The graphite plate according to claim 1, wherein the recess is disposed at a sidewall of the carrying recess away from the central point of the graphite plate body, and the opening of the recess faces away from a bottom surface of the graphite plate body.

13. The graphite plate according to claim 1, wherein the stopper further comprises a stop part, the stop part is divided into an upper region and a lower region, the lower region is located in the recess and the upper region protrudes from a bottom surface of the carrying recess, an interface of the upper region and the lower region is coplanar with the bottom surface of the carrying recess, the upper region includes comprises a first surface facing the central point of the carrying recess, the first surface is a curved surface to form a stop surface for contacting a sidewall of a substrate, the lower region comprises a second surface facing the central point of the carrying recess, and the second surface is a curved surface for contacting with a sidewall of the recess.

14. The graphite plate according to claim 1, wherein the stopper further comprises a stop part perpendicular to a bottom surface of the carrying recess, and a predetermined spacing is provided between the stop part and a sidewall of the carrying recess.

* * * * *